United States Patent
Krishnan et al.

(10) Patent No.: US 7,414,471 B2
(45) Date of Patent: Aug. 19, 2008

(54) COMMON-MODE TECHNIQUE FOR A DIGITAL I/P CLASS D LOOP

(75) Inventors: Jagadeesh Krishnan, Dallas, TX (US); Srinath M Ramaswamy, Dallas, TX (US); Gangadhar Burra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 11/422,509

(22) Filed: Jun. 6, 2006

(65) Prior Publication Data

US 2007/0279126 A1  Dec. 6, 2007

(51) Int. Cl.
 *H03F 3/217* (2006.01)
 *H03F 3/38* (2006.01)
(52) U.S. Cl. .................... 330/251; 330/207 A
(58) Field of Classification Search .................. 330/258
 See application file for complete search history.

(56) References Cited

U.S. PATENT DOCUMENTS 7,262,658 B2 *  8/2007  Ramaswamy et al. ....... 330/251
2005/0083115 A1 *  4/2005  Risbo .......................... 330/10

OTHER PUBLICATIONS

Walker, Geoff, et al., "Bandwidth Considerations for Multilevel Converters", Jan. 1999, vol. 14, No. 1, pp. 74-81.

\* cited by examiner

*Primary Examiner*—Steven J Mottola
(74) *Attorney, Agent, or Firm*—Ronald O. Neerings; Wade James Brady, III; Frederick J. Telecky, Jr.

(57) ABSTRACT

A closed loop amplifier adapted to be directly connected to a battery having a battery voltage for powering the amplifier. The amplifier includes an amplifier stage having a node for receiving a control voltage for controlling a common mode voltage of the stage, a digital voltage indicator for generating a digital value corresponding to the battery voltage, and a common mode voltage supply providing the control voltage corresponding to the digital value.

5 Claims, 6 Drawing Sheets

COMMON-MODE TECHNIQUE FOR A DIGITAL I/P CLASS D LOOP

TECHNICAL FIELD OF THE INVENTION

The present invention relates to amplifiers, such as digital class D architectures, and more particularly relates to controlling the common-mode value in such amplifiers.

BACKGROUND OF THE INVENTION

Today's integrated circuit (IC) industry is driven almost completely by the pursuit of lower cost without sacrificing performance. To achieve this, circuit designers look for ways to reduce the IC die area as they develop attractive solutions to make IC devices more desirable to their customers. In the newly expanding Class-D audio amplification area, an attractive idea is to provide a Class-D amplifier system that runs on a digital pulse width modulation (PWM) input. This is advantageous as it greatly reduces the amount of die area by eliminating the necessity of using a digital-to-analog converter (DAC), thus lowering the cost of production and of implementation.

PWM is obtained by taking a stream of electrical pulses and varying their widths, i.e., their duration in time, as a function of an input. The simplest type of PWM generation is called Natural-PWM (NPWM), and involves comparing the input waveform, which is an analog input, with a triangle wave at a frequency of $f_c$. In addition, the continuing expansion of digital techniques in the field of audio has led to a different type of PWM generation called Uniform-PWM (UPWM) which typically uses a higher order digital modulator to convert a digital Pulse Coded Modulation (PCM) signal to a uniformly sampled PWM. In addition to the sampling method, PWM is traditionally also differentiated by the edge modulation type and by the class. The modulation may also be single sided or double sided. Class AD and Class BD are the standardized abbreviations used to differentiate between two-level and three-level switching.

Once a PWM signal is generated, it can be used to drive a high power output field effect transistor (FET) array. Due to the bi-level nature of a PWM signal, each transistor will be either completely on or completely off, as a result of which the power stage will have a higher efficiency than other analog power stages.

However, even using an ideal NPWM (and UPWM), a subsequent switching power stage will generally add noise and distortion due to switching delays that vary non-linearly with load current. Errors can also be induced by a lower quality triangle wave signal. Similarly, noise and ripple on the power supply for the switching power stage will introduce errors in the system output signal resulting in poor Total Harmonic Distortion (THD) and Power Supply Rejection Ratio (PSRR).

It is known from delta-sigma ($\Delta$-$\Sigma$) converter theory that using an integrator before a noise adding element and then feeding back the inverse of the output pushes the added errors high into the frequency band. If the errors are pushed above the audio band, an external low-pass filter can be used to extract the audio signal from the PWM waveform. The same principle has been used for many existing Class-D architectures. Most of the existing architectures for Class-D operate on analog inputs and hence require the presence of a DAC, and also need an analog ramp at the input of the comparator to generate the PWM output.

Although prior art architectures can also work with digital PWM inputs, they still need an analog ramp at the input of the comparator. This is not very desirable since the presence of an analog ramp can create intermodulation distortion because of the carrier modulating with the PWM input. In order to avoid this, the ramp frequency and the carrier frequency of the digital PWM input should be perfectly matched. This is a very tight factor to control.

A prior art solution has been proposed that uses a square wave feeding in into the integrator in order to create a ramp. However, this architecture does not completely eliminate intermodulation distortion due to the square wave modulating with the input PWM's carrier. Solutions that have been proposed to overcome this are generally not area effective, because of the size of the passive devices that end up being required. Furthermore, the presence of clock jitter and duty cycle modulation can also cause noise in the system.

Still further, in a generic, single-ended Class-D amplifier, the common-mode value of the integrator should change based on the voltage of the power supply, e.g. battery. However, prior art techniques for achieving this, while improving the PSRR, do so at the cost of a large amount of silicon area, because, for example, they do so by adding either a very large RC filter on the chip or by using an extra pin to connect to an external RC filter, in both cases to create a sub-Hertz pole.

SUMMARY OF THE INVENTION

The present invention provides a solution to the problem of maintaining a substantially constant common mode in a generic single-ended amplifier, while obtaining comparable or better PSRR as in the prior art, but not at the expense of large increases in silicon area. This is accomplished by providing a closed loop amplifier adapted to be directly connected to a battery having a battery voltage for powering the amplifier. The amplifier includes an amplifier stage having a node for receiving a control voltage for controlling a common mode voltage of the stage, a digital voltage indicator for generating a digital value corresponding to the battery voltage, and a common mode voltage supply providing the control voltage corresponding to the digital value.

In a preferred embodiment, a single-ended Class-D amplifier is powered by a power supply providing power by way of a power supply voltage node and a ground node, the amplifier having improved common-mode voltage control. A first integrator stage receives an input signal and provides an output signal, the integrator stage having a first common-mode reference voltage applied thereto for control of the common-mode voltage of the integrator stage. A second integrator stage receives an input signal and provides an output signal, the integrator stage having a second common-mode reference voltage applied thereto for control of the common-mode voltage of the integrator stage. A comparator stage receives the output of the first integrator stage and the output of the second integrator stage and provides an output signal corresponding to the difference between them. An output stage provides an output of the amplifier. A digital voltage indicator generates a digital value corresponding to the voltage at the power supply voltage node, while a common-mode voltage supply provides the first common-mode reference voltage corresponding to the digital value.

These and other aspects and features of the invention will be apparent to those skilled in the art from the following detailed description of the invention, taken together with the accompanying drawings.

DETAILED DESCRIPTION OF THE PREFERRED EMBODIMENT

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1:
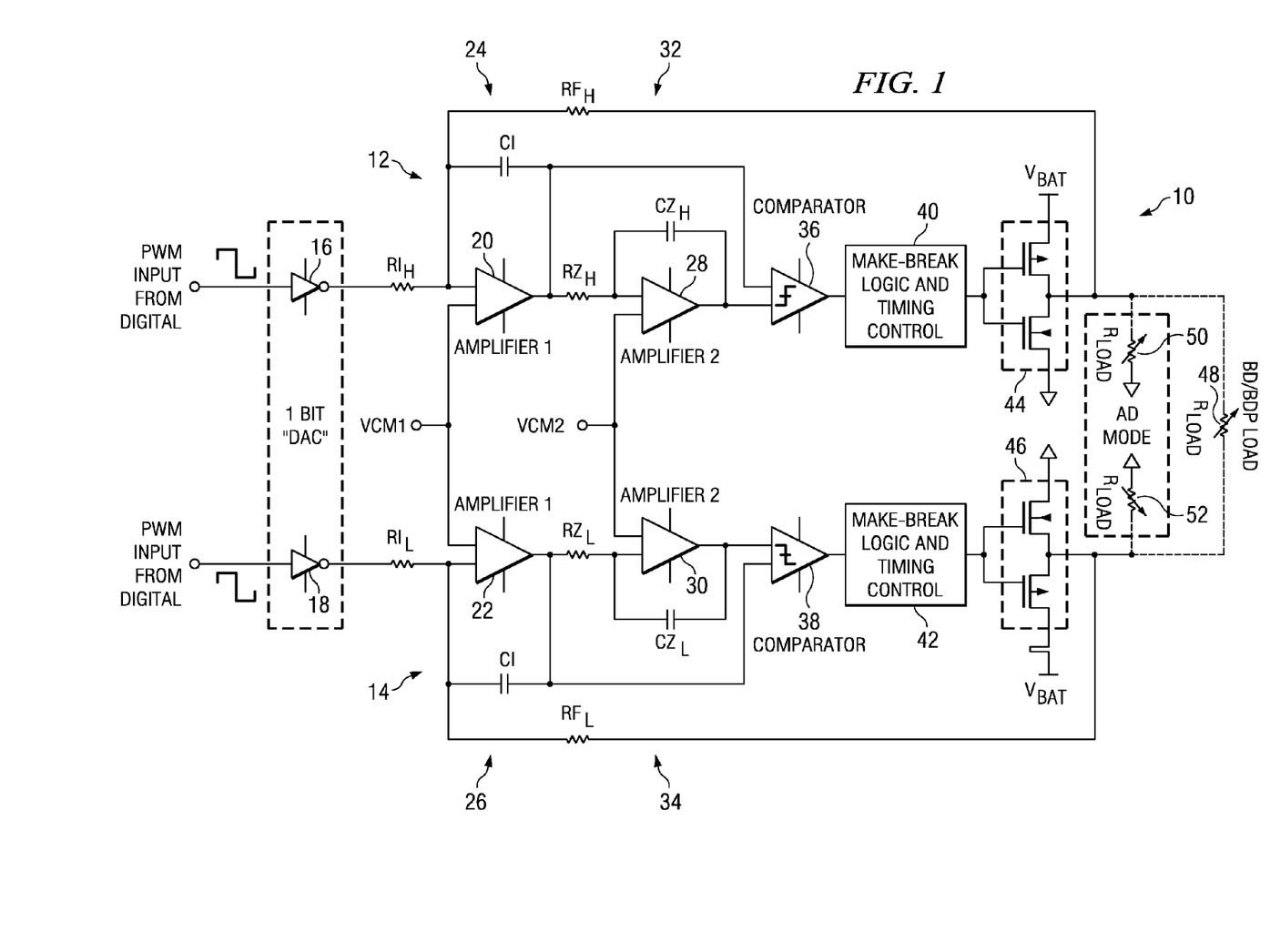
FIG. 1 is a high level diagram of a higher order, Class-D amplifier.

FIG. 1 presents a high level diagram of a higher order, differential Class-D amplifier 10 including a preferred embodiment of the present invention. The amplifier includes two signal paths, a high side path 12 and a low side path 14. A high side input PWM signal is provided to a 1-bit DAC 16, while a low side input PWM signal is provided to another 1-bit DAC 18. The output of each DAC 16, 18, is provided to a non-inverting input of a first operational amplifier, 20, 22, respectively, through a respective resistor $R1_H$, $R1_L$. A first common mode voltage, VCM1, is applied to the inverting inputs of both operational amplifiers, 20, 22. Each operational amplifier, 20, 22, has a respective feedback capacitor $C1_H$, $C1_L$ between its output and non-inverting input, thus, with resistors $R1_H$, $R1_L$, constituting each amplifier circuit as an integrator, 24, 26, respectively, as shown.

Similarly, the output of each operational amplifiers, 20, 22, is provided to a non-inverting input of a second operational amplifier, 28, 30, respectively, through a respective resistor $R2_H$, $R2_L$. A second common mode voltage, VCM2, is applied to the inverting inputs of operational amplifiers, 28, 30. Each operational amplifier, 28, 30, has a respective feedback capacitor $C2_H$, $C2_L$ between its output and non-inverting input, thus, with respective resistors $R2_H$, $R2_L$, constituting each amplifier circuit as an integrator, 32, 34, respectively, as shown.

The outputs of the operational amplifiers, 28, 30, are connected to an input of respective comparators 36, 38, the other input of which is connected to the output of the respective operational amplifier, 28, 30, of the path. The outputs of the comparators 36, 38, are connected to the input of respective make-break logic and timing control circuits 40, 42, which may be of conventional design. The outputs of the make-break logic and timing control circuits 40, 42, are connected to respective power drivers 44, 46, each comprising a positive-type field effect transistor (PFET) device and a negative-type field effect transistor (NFET) device connected in series between the battery voltage VBAT and ground and having their gates connected to the respective output of the make-break logic and timing control circuits 40, 42, as shown.

The outputs of drivers 44, 46, are fed back to the non-inverting inputs of the respective operational amplifiers, 20, 22, for the path through respective feedback resistors $RF_H$, $RF_L$. The outputs of drivers 44, 46, also constitute the differential outputs of differential Class-D amplifier 10, which may be provided to a load 48 connecting the outputs in the case of a Class BD, or a pseudo-BD ("Class BDP") mode architecture (described in commonly assigned and co-pending U.S. patent application Ser. No. 11/193,871, filed on Jul. 29, 2005), or to respective loads to ground 50, 52, in the case of a Class AD mode architecture.

In each path 12, 14, the two integrators 24, 32; 26, 34, form a second order loop filter that corrects an error signal that is the difference of an input PWM and a feedback PWM signal fed back from the power drivers 44, 46, through resistors $RF_H$, $RF_L$. The outputs of the comparators 36, 38, switch based on the outputs of the respective two integrators, and an H-bridge, comprised of the power drivers 44, 46, generates the feedback PWM signal. The feedback loop operates to maintain the area, i.e., the product of voltage and time, of the output pulses to be the same as the input pulses.

Figure 2:
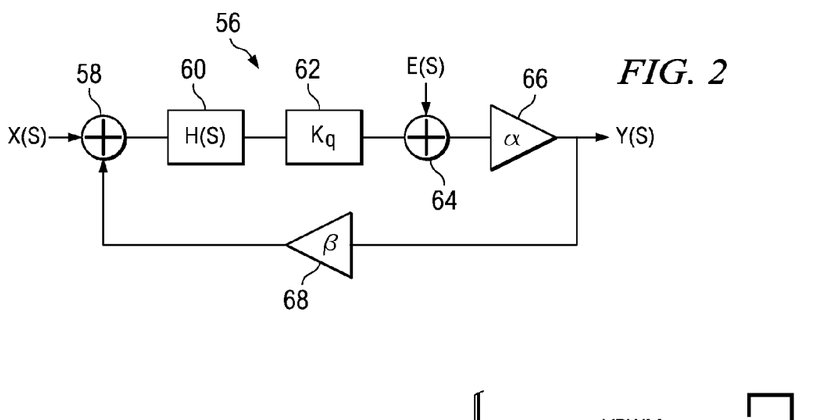
FIG. 2 is a diagram of a linearized model of the amplifier of FIG. 1.

FIG. 2 shows a linearized model 56 of the higher order Class-D amplifier of FIG. 1. In the model, an input signal X(S) is provided to one input of a first adder 58 the output of which is provided to the input of a second order filter 60. The output of the filter 60 is provided to the input of a single bit quantizer 62. The output of quantizer 62 is provided to one input of a second adder 64, the output of which is provided to a power stage 66. The other input of the second adder 64 is a noise source E(S). The output of the power stage 66 is fed back to the other input of the first adder 58, and is the output Y(S) of the model amplifier 56.

The transfer function of the second order loop-filter 60 is represented by H(s) and the single bit quantizer 62 is modeled as a simple gain element having a gain factor of $K_q$, followed by the additive noise source E(S). The power stage 66 is modeled as a linear gain of α (since the loop delay is of the order of nanoseconds) and the feedback factor is denoted by β. The change in the battery voltage will also change a proportionally.

The system is characterized by a signal transfer function (STF) and an error transfer function (ETF), while the loop-filter is characterized by the system's open loop transfer function (OTF). Good error suppression is obtained by maximizing the loop-filter gain in the audio band, and the error suppression is set by the loop-filter gain. The following equations describe the OTF, STF and the ETF of the system.

$$OTF = K_q \alpha H(s), \quad \text{Eq. (1)}$$

$$STF = \frac{K_q \alpha H(s)}{1 + K_q \alpha \beta H(s)}, \text{ and} \quad \text{Eq. (2)}$$

$$ETF = \frac{1}{\alpha \beta K_q H(s)}. \quad \text{Eq. (3)}$$

The loop-filter H(s) is a second order loop-filter and can be mathematically expressed as $$H(s) = \frac{K_1}{\left(\frac{s}{p_1}+1\right)} + \frac{K_1 K_2}{\left(\frac{s}{p_1}+1\right)\left(\frac{s}{p_2}+1\right)} \quad \text{Eq. (4)}$$

where $p_1$ and $p_2$ are the poles of the first and the second integrators, and $K_1$ and $K_2$ are the DC-gains of the first and the second integrators, respectively. The higher the $K_1$ and $K_2$, the higher will be the error suppression. Typically the DC-gain is in the order of 90 dB. Examining the steady-state response y(t) of the filter:

$$y(t) = K_1 * (1 - e^{-p_1 t}) + K_1 K_2 * \left[\frac{1 + \{p_2 e^{-p_1 t} - p_1 e^{-p_2 t}\}}{p_1 - p_2}\right]. \quad \text{Eq. (5)}$$

Looking at the Taylor's series expansion of Equation (5), neglecting the higher order terms (since the loop-delay is in the order of ns, all higher order terms can be neglected):

$$y(t) \approx K_1 p_1 t. \quad \text{Eq. (6)}$$

Figure 3:
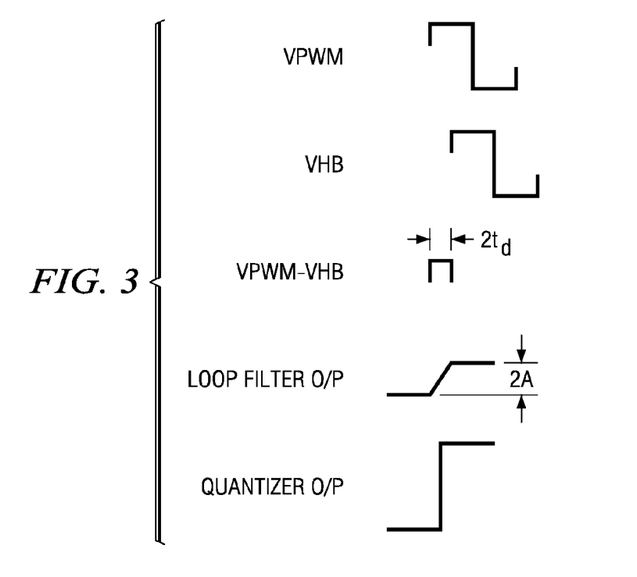
FIG. 3 is a diagram showing the steady-state time domain voltage response of several signals in the loop filter 60 and quantizer 62 of FIG. 2.

FIG. 3 shows the steady-state time domain response of the loop-filter 60 and of the quantizer 62 for voltage signals VPWM (of the PWM input signal), VHB (of the H-Bridge output signal), VPWM-VHB (of the difference between VPWM and VHB), loop filter output and quantizer output. In FIG. 3, $t_d$ is defined as the loop-delay of the system. This is set by the gate-drivers needed to run the power-FETs of the power stage 66. Once the input changes, the loop filter 60 begins changing with an approximately linear slope. After the filter output crosses zero, the quantizer 62 changes states, and this shows up at the output after a time delay of $t_d$. During this time, the filter continues its linear change, and hence the total switching time is $2t_d$, assuming there is no noise in the system. Hence the maximum loop-filter amplitude can be expressed as $$A = 2K_1 p_1 t_d. \quad \text{Eq. (7)}$$

The loop-filter maximum amplitude can therefore be expressed as $$A = \frac{2K_1 t_d}{(1+K_1)R_1 C_1} \cong \frac{2t_d}{R_1 C_1}. \quad \text{Eq. (8)}$$

Note in Equation (8) that the lesser the error signal, the higher is the performance. Hence, it is desirable to have the loop-filter amplitude (and hence the loop-delay) as small as possible. The loop-delay is a function of the driver delay. Worst case loop-delay may be calculated by characterizing the drivers across process, voltage and temperature corners. Thus:

$$R_Z C_Z = \sqrt{3} R_1 C_1 \quad \text{Eq. (9)}$$

The double Fourier series expression for an AD PWM input is given as:

$$u(t) = 2A_x \sin\left(\varpi_x \frac{t_s}{2}\right) \cos(\varpi_x t) - \quad \text{Eq. (10)}$$

$$\sum_{n=1}^{\infty} \frac{8}{n\pi} \left\{ \sin\left(\frac{n\pi}{2}\right) \left[ J_o(\beta_n) \sin(n\varpi_s t) \sin\left(\frac{n\varpi_s t_s}{2}\right) \right] \right\} +$$

$$\sum_{n=2,even}^{\infty} J_k\left(\frac{\pi A_x}{2}\right) [\sin(\varpi_s - k\varpi_x)t + \sin(\varpi_s + k\varpi_x)t]$$

Figure 4:
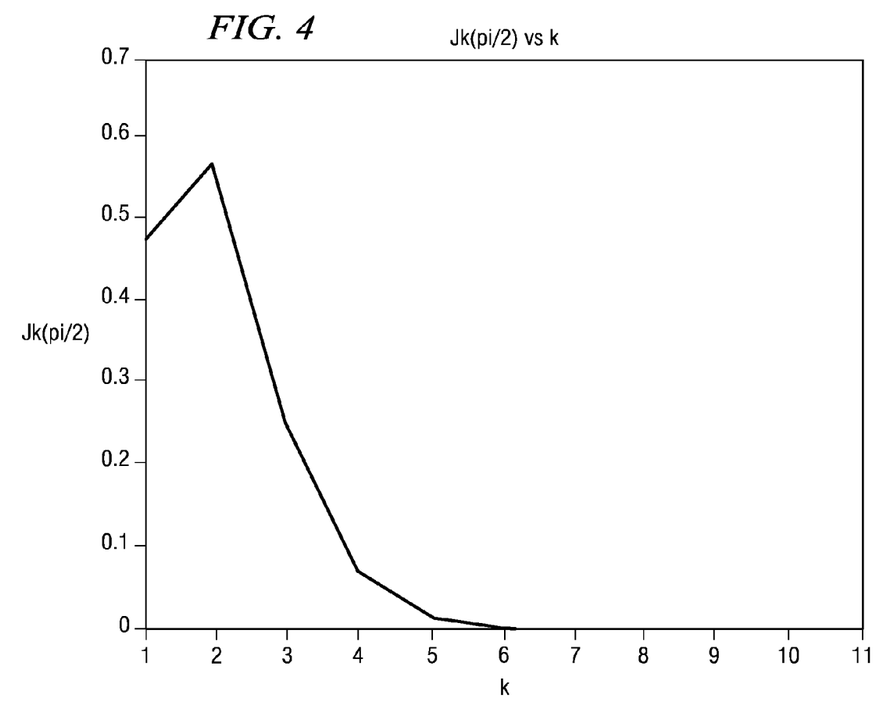
FIG. 4 is a graph showing the Bessel function versus k of the amplifier of FIG. 1.

The first portion of Equation (10) is the audio-band frequency component and the second term is attenuated by the loop and should not be seen, ideally, at the output. But, in order to find out if any of the harmonics caused by the subtraction of the system output from the PWM input fold down into the audio-band, the magnitude of the second term in Equation (10) has to be evaluated at $\pi/2$. This is the worst case situation where the input reaches ±1. Equation (11) defines the lowest 'k' harmonic that falls into the audio-band:

$$f_c - k_{min} f_i = f_p, \quad \text{Eq. (11)}$$

where $f_p$ is the unity gain bandwidth (UGBW) of the first integrator, $f_i$ is the maximum input frequency in the audio-band and $f_c$ the carrier frequency. FIG. 4 shows that if k>8, the Bessel function approximates to zero and hence:

$$f_p \leq f_c - 8 f_i, \quad \text{Eq. (12)}$$

which means that the UGBW of the first integrator has to be less than 224 KHz, when $f_c$=384 KHz.

Figure 5:
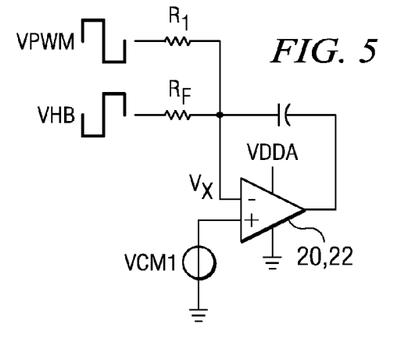
FIG. 5 is a diagram of a selected portion of the amplifier of FIG. 1.

With reference now to FIG. 5, which is a selected portion of the circuit of FIG. 1, the determination of $R_F$ is performed as follows. Applying Kirchoff's Current Law, to node $V_x$:

$$\frac{V_{DDA}-0}{R_1} = \frac{V_{BAT}-0}{R_F} \Rightarrow R_F = \left(\frac{V_{BAT}}{V_{DDA}}\right) * R_1. \quad \text{Eq. (13)}$$

However, in any battery-operated system, $V_{BAT}$ varies with time, which means that $R_F$ has to be changed based on $V_{BAT}$. But, the straightforward way of doing this entails the use of switches in the feedback path. On the other hand, $R_F$ can be fixed as long as it is chosen in such a way that:

$$R_F \geq \left(\frac{V_{BAT,max}}{V_{DDA,min}}\right) * R_1. \quad \text{Eq. (14)}$$

Figure 6:
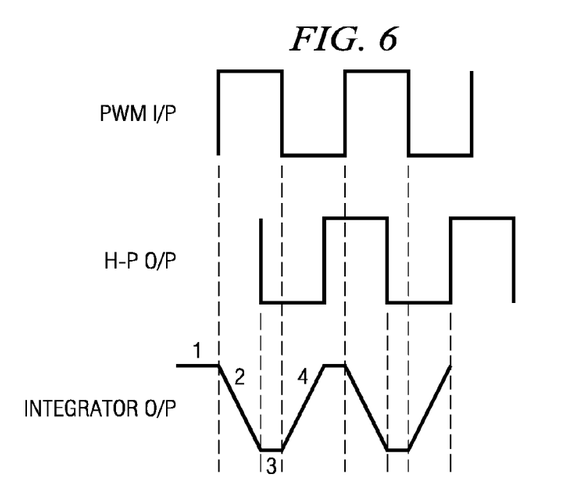
FIG. 6 is a diagram showing the time domain voltage response of several signals in the amplifier of FIG. 1.

As mentioned above, controlling the common mode for a Class D amplifier is an important consideration. This will now be discussed in more detail in connection with the amplifier of FIG. 1, by way of further background for understanding the preferred embodiments disclosed herein. FIG. 6 shows the H-bridge output, H-B O/P, and first integrator output, Integrator O/P, for a PWM input, PWM I/P, with four conditions identified. It is desirable to have the current in the feedback capacitor to be "0" during conditions 1 and 3. During condition 1:

$$\frac{V_{BAT} - V_{CM1}}{R_F} = \frac{V_{CM1}}{R_1} \Rightarrow V_{CM1} = \frac{V_{BAT}}{\left(1 + \frac{R_1}{R_F}\right)}. \quad \text{Eq. (15)}$$

During condition 3

$$\frac{V_{DDA} - V_{CM1}}{R_1} = \frac{V_{CM1}}{R_F} \Rightarrow V_{CM1} = \frac{V_{DDA}}{\left(1 + \frac{R_1}{R_F}\right)}. \quad \text{Eq. (16)}$$

From Equation (15) and Equation (16) it can be observed that conditions 1 and 3 result in the same common-mode value only when:

$$\frac{V_{BAT}}{V_{DDA}} = \frac{R_F}{R_1}, \quad \text{Eq. (17)}$$

which means that resistor $R_F$ (or $R_1$) must be switched whenever $V_{BAT}$ changes. This is a problem, because the variation in $V_{BAT}$ is in continuous time, whereas resistor $R_F$ can only be switched in discrete steps. Another way of calculating the common-mode for the first integrator is to look at common-mode current equation:

$$\frac{\frac{V_{BAT}}{2} - V_{CM1}}{R_F} + \frac{\frac{V_{DDA}}{2} - V_{CM1}}{R_1} = 0 \Rightarrow \quad \text{Eq. (18)}$$

$$V_{CM1} = \frac{\frac{V_{DDA}}{2}}{\left(1 + \frac{R_1}{R_F}\right)} + \frac{\frac{V_{BAT}}{2}}{\left(1 + \frac{R_F}{R_1}\right)}$$

It can be observed that Equation (18) is the average of Equation (15) and Equation (16). Hence $V_{CM1}$ can be implemented using Equation (18). But Equation (18) shows that $V_{CM1}$ is a function of the battery voltage, which means that any ripple on the battery will be seen at the output with very little suppression. This will be a direct hit on the PSRR of the system. In accordance with a preferred embodiment of the present invention, a new technique is used, which we call "switchable common-mode," to solve this problem.

Figure 7:
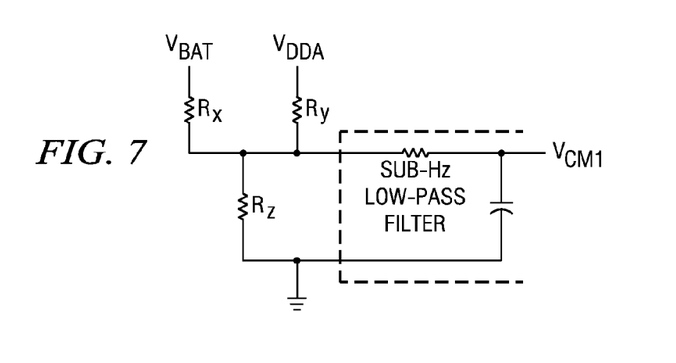
FIG. 7 is a circuit diagram of a prior art low-pass filter.
Figure 8:
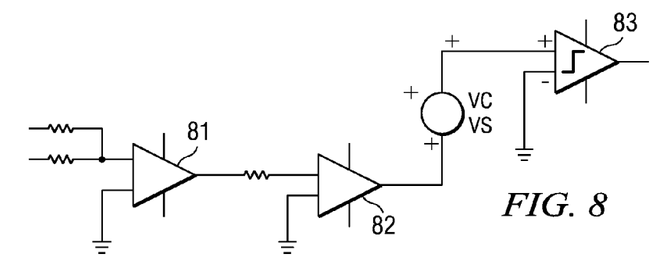
FIG. 8 is a circuit diagram of a first conventional summing comparator.
Figure 9:
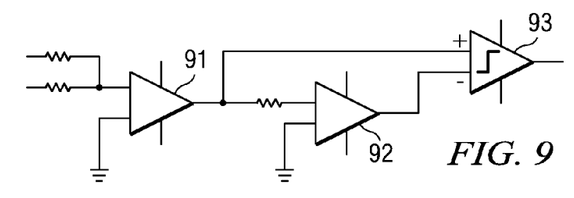
FIG. 9 is a circuit diagram of a second conventional summing comparator.
Figure 10:
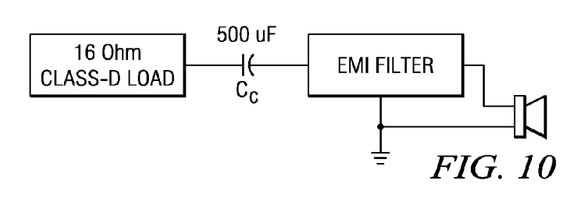
FIG. 10 is a diagram of an output arrangement for a Class-D amplifier.
Figure 11:
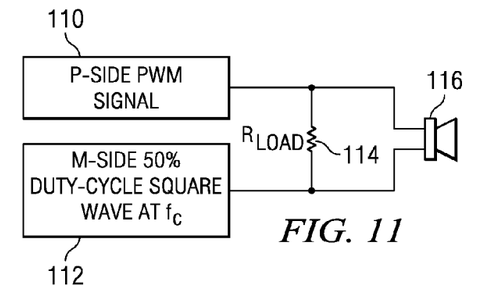
FIG. 11 is a diagram of an arrangement for generating a pseudo-BD output.
Figure 12:
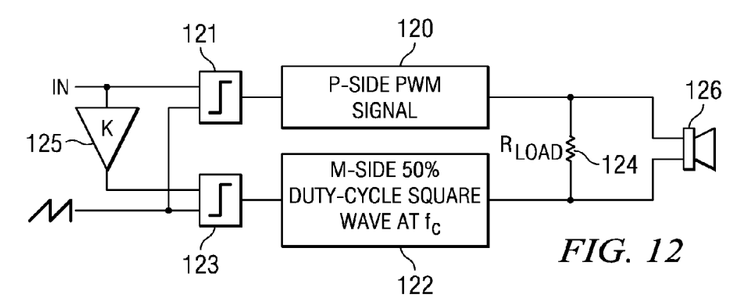
FIG. 12 is another arrangement for generating a pseudo-BD output.
Figures 13, 14:
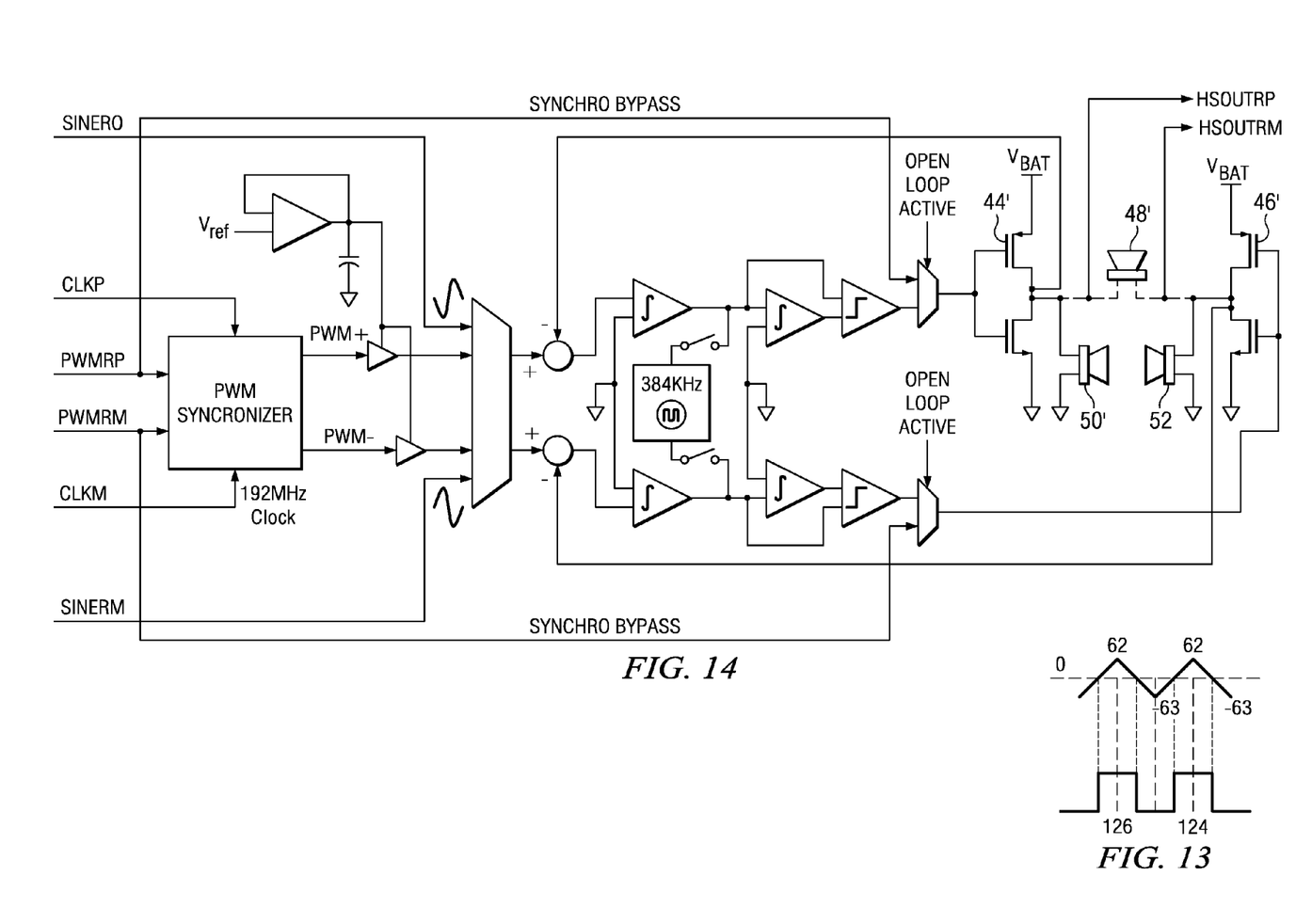
FIG. 13 is a signal diagram of signal level versus time showing a P-side signal and an M-side signal from the arrangement of FIG. 12.
FIG. 14 is a diagram showing a reconfigurable arrangement for generating a pseudo-BD output.
Figure 15:
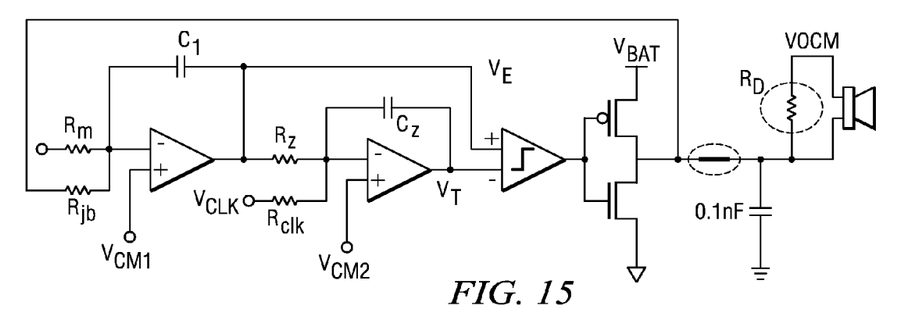
FIG. 15 is a selected portion of the amplifier of FIG. 14.

Before describing embodiments of our invention, however, to briefly reiterate, in the typical single-ended, direct-battery-hookup Class-D amplifier, the common-mode is not fixed and changes with the battery value. The common-mode needs to be a function of the battery voltage in order to avoid erroneous pulse generation. However, this results in a degradation of the PSRR, as mentioned above. In order to maintain a high PSRR, in the prior art a sub-hertz low-pass filter has been proposed, as shown in FIG. 7. However, such a low-pass filter has a very low pole set by the RC filter, and therefore requires huge passive components which, in turn, require a huge silicon area.

In accordance with a preferred embodiment of the present invention, the common-mode of the first integrator is switched in real-time based on the battery information obtained from a DSP. The granularity of different settings for the common-mode depends on the amount of offset that the system can tolerate. In this method, $V_{CM1}$ is generated, using Equation (18), from a buffer that runs on a regulated power-supply. In a typical battery-based system, the rate of change in battery voltage is in the order of seconds, and the DSP present in these systems can be used to obtain the battery reading and change the setting on the common-mode buffer through a register bit. In fact, in typical battery-based systems including a DSP, for example cell phones, laptop computers, etc., they already include a battery monitoring function, with the DSP outputting a digital word corresponding to the battery voltage. That digital word may be used in implementing the present invention in such systems. Of course, a DSP need not be used; all that is required that some form of battery voltage monitoring be provided, with provision of a digital word representing the battery voltage. This may be done with a sensor and analog-to-digital converter, combinatorial logic, ASIC, or the like.

Figure 16A:
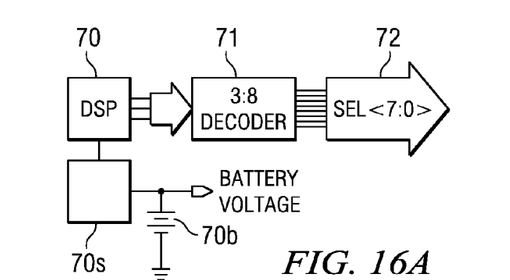
FIGS. 16A and 16B are diagrams showing an embodiment of a common-mode switching power supply.
Figure 16B:
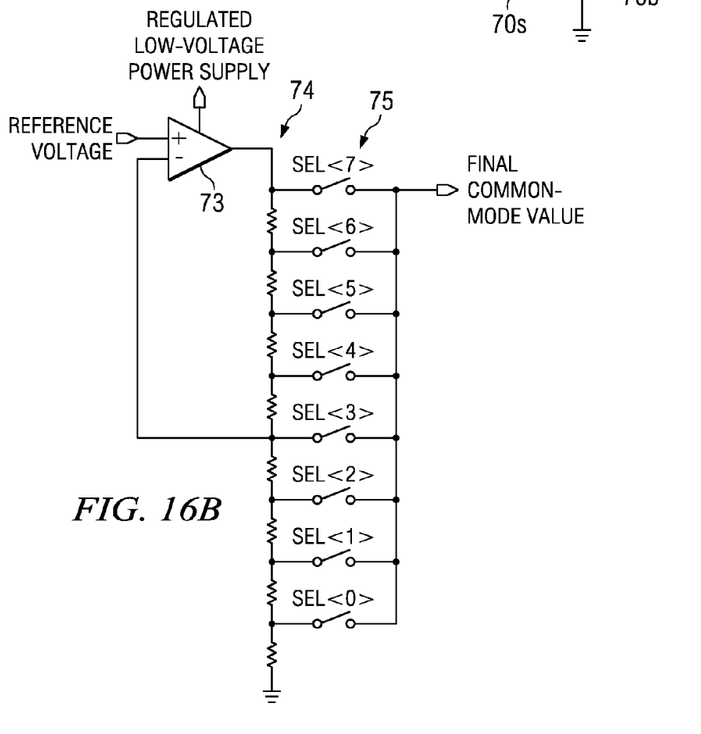

An embodiment of a common-mode switching power supply is shown in FIGS. 16A and 16B. As shown in FIG. 16A, a DSP 70 outputs a 3-bit word that represents the battery voltage, to a 3:8 decoder 71. The 3-bit word, for example, could be coded such that "111" represents a battery voltage of 4.8 V and "000" represents a battery voltage of 2.7 V, with intermediate values of the 3-bit word representing intermediate values of the battery voltage between 4.8 V and 2.7 V, for example separated by equal voltage differences. The DSP 70 may, for example, generate this 3-bit word based on the output of a conventional prior art voltage sensor with digital output 70s monitoring the system battery 70b. Since the rate of change in the battery voltage is, as mentioned above, in minutes if not hours, thee bits would be sufficient to represent the battery voltage in many applications. The user may choose to increase or decrease the granularity of voltage representation depending on the application.

The 3-bit word is converted into an 8-bit thermometer code SEL<7:0> in the 3:8 decoder 71, which is output on eight corresponding bit lines 72 and provided to the regulator portion of the common-mode switching power supply, shown in FIG. 16B. In it, a reference voltage is provided to the non-inverting input of an operational amplifier 73, which is powered from a regulated low-voltage power supply and operates as a buffer. The output of amplifier 73 is provided to one end of a series connected string 75 of eight equal-valued resistors, the other end of which is connected to ground, as shown. The connecting nodes of the resistors in string 74, as well as the output of amplifier 73, are connected to one port of one of eight respective switches, the other ports all being connected together and forming the final common-mode value. The switches are controlled by a respective one of the eight corresponding bit lines 72, with the least-significant-bit ("LSB") being connected to the switch closest to ground and the most-significant-bit ("MSB") being connected to the switch connected to the output of buffer (amplifier) 73. The connecting node that is connected to the switch controlled by thermometer code bit SEL<3> is also connected to the inverting input of amplifier 73.

In operation, when SEL<7:0> is "10000000", the buffer 73 outputs a common-mode value corresponding to a battery voltage VBAT of 4.8 V. When the DSP updates the battery value, the thermometer code SEL<7:0> changes to reflect the new battery value, and the buffer 73 generates the common-mode value corresponding to the new battery value. The values of the resistors are chosen such that the final common-mode output voltage is a function of the DC value of the battery voltage and the regulated low-voltage power supply, as set forth in Equation (18).

Table 1 shows exemplary common-mode values for different battery settings when the system can tolerate a worst-case offset of 40 mV.

TABLE 1

| $V_{BAT}$ | $V_{CM1}$ |
|---|---|
| 4.80 | 0.82 |
| 4.45 | 0.79 |
| 4.15 | 0.76 |
| 3.85 | 0.73 |
| 3.50 | 0.70 |
| 3.10 | 0.67 |
| 2.70 | 0.64 |
| 1.80 | 0.57 |

For example, when $V_{BAT}$=4.8V, $V_{CM1}$ is 0.82V and remains so until $V_{BAT}$=4.46V. If $V_{BAT}$ changes to 4.45V, $V_{CM1}$ gets updated to 0.79V. A drawback with this method is the possibility of click and pop noise at the output, when the common-mode is switched. However, this can be solved by employing a low-pass filter for smoothing. The pole of such a filter need not be low. Furthermore, the closed loop response of the second order Class-D loop, as shown in FIG. 1, is like a low pass filter with a pole at approximately 60 KHz. Therefore, any transient due to common-mode switching is considerably damped. Given that the change in battery voltage, and hence the switching of common-mode, happens in hours, the loop should reasonably suppress any click and pop effects due to common-mode switching. In the unlikely event that the switching causes a perceptible audio degradation, digital techniques for varying the input PWM switching can be employed with very little or no silicon area penalty.

When $V_{BAT}$ changes, $V_{CM1}$ and, hence, the magnitude of the input, also changes. The maximum input to the Class-D loop can be determined from Equation (19).

$$\text{Maximum } I/P \text{ to the loop} = 20*\log10\left[\frac{2*\left(V_{bat,new} - \frac{V_{bat,CM}}{2}\right) - 0.8}{\left(\frac{R_F}{R_1}\right)}\right] \quad \text{Eq. (19)}$$

In Equation (19), $V_{bat, new}$ represents the value of $V_{BAT}$ at the given instant and $V_{bat, CM}$ represents the value of $V_{BAT}$ from Table 1 that is closest to $V_{bat, new}$. The drop in output voltage due to $r_{ds, on}$ is assumed to be 0.8 V in an exemplary technology. This drop will vary, depending on the technology of the chip and the output load that is driven.

Although the present invention and its advantages have been described in detail, it should be understood that various changes, substitutions and alterations can be made herein without departing from the spirit and scope of the invention as defined by the appended claims.

What is claimed is:

1. A closed loop amplifier adapted to be directly connected to a battery having a battery voltage for powering the amplifier, comprising:
    an amplifier stage having a node for receiving a control voltage for controlling a common mode voltage of the stage;
    a digital voltage indicator for generating a digital value corresponding to the battery voltage; and
    a common mode voltage supply providing the control voltage corresponding to the digital value.

2. A Class-D amplifier being powered by a power supply providing power by way of a power supply voltage node and a ground node, the amplifier having improved common-mode voltage control, comprising:
    a first integrator stage receiving an input signal and having an output signal, the integrator stage having a first common-mode reference voltage applied thereto for control of the common-mode voltage of the integrator stage;
    a second integrator stage receiving an input signal and having an output signal, the integrator stage having a second common-mode reference voltage applied thereto for control of the common-mode voltage of the integrator stage;
    a comparator stage receiving the output of the first integrator stage and the output of the second integrator stage and providing an output signal corresponding to the difference between them;
    an output stage for providing an output of the amplifier;
    a digital voltage indicator generating a digital value corresponding to the voltage at the power supply voltage node; and
    a common-mode voltage supply providing the first common-mode reference voltage corresponding to the digital value.

3. A method for controlling a common mode voltage provided to a stage in an amplifier powered by a battery, comprising the steps of:
    sensing the voltage of the battery and providing a digital word representing the sensed voltage;
    controlling a digitally controllable voltage source with the digital word to provide a common mode voltage corresponding to the sensed voltage; and
    providing the common mode voltage to the amplifier stage.

4. A method according to claim 3 wherein the digitally controllable voltage source comprises a series string of resistors connected between two nodes of a voltage source and a corresponding plurality of switches connected so as to selectably connect respective common nodes of the resistors to an output node under control of the digital word, wherein each switch of which is controlled by a respective bit of the digital word, and wherein the step of providing a digital word is performed by providing a thermometer code.

5. An amplifier according to claim 1 wherein the digital voltage indicator comprises a voltage sensor coupled to a digital signal processor.

* * * * *